(12) United States Patent  
Chau et al.

(10) Patent No.: US 12,419,065 B2  
(45) Date of Patent: Sep. 16, 2025

(54) SCHOTTKY DEVICE AND METHOD OF MANUFACTURING THE SAME

(71) Applicant: Alpha Power Solutions Limited, Hong Kong (CN)

(72) Inventors: Wing Chong Tony Chau, Hong Kong (CN); Wing Kit Cheung, Hong Kong (CN); Wai Tien Chan, Hong Kong (CN)

(73) Assignee: Alpha Power Solutions Limited (CN)

( * ) Notice: Subject to any disclaimer, the term of this patent is extended or adjusted under 35 U.S.C. 154(b) by 358 days.

(21) Appl. No.: 17/456,728

(22) Filed: Nov. 29, 2021

(65) Prior Publication Data

US 2022/0085217 A1 Mar. 17, 2022

Related U.S. Application Data

(63) Continuation of application No. 16/740,224, filed on Jan. 10, 2020, now Pat. No. 11,217,707, which is a (Continued)

(30) Foreign Application Priority Data

Sep. 8, 2017 (CN) .......................... 201710809729.7

(51) Int. Cl.  
*H10D 8/60* (2025.01)  
*H10D 8/01* (2025.01)  
(Continued)

(52) U.S. Cl.  
CPC ............... *H10D 8/60* (2025.01); *H10D 8/051* (2025.01); *H10D 62/106* (2025.01);  
(Continued)

(58) Field of Classification Search  
CPC ... H01L 29/872–8725; H01L 29/66143; H01L 29/66212; H01L 29/47;  
(Continued)

(56) References Cited

U.S. PATENT DOCUMENTS 5,262,669 A * 11/1993 Wakatabe ................ H10D 8/00  
257/E29.338  
9,111,852 B2 * 8/2015 Aketa ................ H10D 62/8303  
(Continued)

FOREIGN PATENT DOCUMENTS

CN 102263139 A 11/2011  
CN 102437201 A 5/2012  
(Continued)

*Primary Examiner* — Wael M Fahmy  
*Assistant Examiner* — Quinton A Brasfield  
(74) *Attorney, Agent, or Firm* — Robert D. Atkins; PATENT LAW GROUP: Atkins and Associates, P.C.

(57) ABSTRACT

A Schottky device includes a silicon carbide (SiC) substrate of a first conductivity type, a drift layer of the first conductivity type, a trench, a barrier layer of a second conductivity type, an electrically conductive material that at least partially fills the trench and contacts the barrier layer, a first electrode, and a second electrode. The drift layer is formed of SiC and is situated onto the SiC substrate. The trench extends from the top surface of the drift layer towards the SiC substrate. The barrier layer contacts the drifting layer and covers a sidewall and a bottom wall of the trench. The first electrode forms a Schottky junction with the drift layer and forms a low resistivity contact with the barrier layer and the electrically conductive material. The second electrode forms an ohmic contact with the SiC substrate.

17 Claims, 8 Drawing Sheets

Related U.S. Application Data continuation of application No. 15/705,242, filed on Sep. 14, 2017, now Pat. No. 10,586,876.

(51) Int. Cl.
  *H10D 62/10* (2025.01)
  *H10D 62/60* (2025.01)
  *H10D 62/82* (2025.01)
  *H10D 62/832* (2025.01)
  *H10D 64/64* (2025.01)

(52) U.S. Cl.
  CPC ............. *H10D 62/60* (2025.01); *H10D 62/82* (2025.01); *H10D 62/8325* (2025.01); *H10D 64/64* (2025.01); *H10D 62/126* (2025.01)

(58) Field of Classification Search
  CPC ........... H01L 29/0495; H01L 29/66848; H01L 29/812; H01L 29/0619; H01L 29/267; H10D 8/051; H10D 8/60; H10D 62/82; H10D 62/126
  See application file for complete search history.

(56) References Cited

U.S. PATENT DOCUMENTS

| | | |
|---|---|---|
| 2011/0175106 A1 | 7/2011 | Mizukami et al. |
| 2012/0228636 A1 | 9/2012 | Maeyama et al. |
| 2012/0241897 A1 | 9/2012 | Qu et al. |
| 2013/0264582 A1* | 10/2013 | Hayashi ............... H10D 62/111 257/77 |
| 2014/0145289 A1 | 5/2014 | Zhang |
| 2015/0115286 A1 | 4/2015 | Takeuchi et al. |
| 2016/0211387 A1 | 7/2016 | Zhang |
| 2016/0260830 A1 | 9/2016 | Nakano et al. |
| 2016/0276442 A1* | 9/2016 | Oota .................. H01L 21/0485 |
| 2017/0170264 A1 | 6/2017 | Mauder et al. |
| 2017/0271528 A1* | 9/2017 | Oota ....................... H10D 8/50 |

FOREIGN PATENT DOCUMENTS

| | | |
|---|---|---|
| CN | 102473738 A | 5/2012 |
| CN | 102683430 A | 9/2012 |
| CN | 103346169 A | 10/2013 |
| JP | 2013021358 A | 1/2013 |
| JP | 2013120784 A | 6/2013 |

* cited by examiner

410

420

| Quantiles | | | | | | | |
|---|---|---|---|---|---|---|---|
| Level | Minimum | 10% | 25% | Median | 75% | 90% | Maximum |
| Buffer JBS | 2.022468 | 2.063854 | 2.219544 | 2.579208 | 3.207387 | 3.499552 | 3.520245 |
| Std JBS | 9.718282 | 9.765581 | 11.49197 | 12.22115 | 14.75357 | 61.65909 | 84.24387 |

SCHOTTKY DEVICE AND METHOD OF MANUFACTURING THE SAME

CLAIM TO DOMESTIC PRIORITY

The present application is a continuation of U.S. patent application Ser. No. 16/740,224, now U.S. Pat. No. 11,217,707, filed Jan. 10, 2020, which is a continuation of U.S. patent application Ser. No. 15/705,242, filed Sep. 14, 2017, which applications are incorporated herein by reference.

FIELD OF THE INVENTION

The present invention relates to a semiconductor device, and more particularly to a Schottky device.

BACKGROUND OF THE INVENTION

Schottky devices include a Schottky junction formed between a semiconductor layer and a metal layer. The Schottky devices are characterized by a lower forward voltage drop and a faster switching action compared with general PN junction diodes.

Silicon carbide (SiC) is a wide-gap semiconductor material with a forbidden band gap between 2.35 eV and 3.28 eV. A SiC-based semiconductor is thermally, chemically and mechanically stable and is suitable for applications where high power, high speed, high temperature is required.

New devices and processes that assist in advancing technological needs and industrial applications in semiconductor field are desirable.

SUMMARY OF THE INVENTION

One example embodiment provides a Schottky device. The Schottky device includes a silicon carbide (SiC) substrate of a first conductivity type, a drift layer, a trench, a barrier layer of a second conductivity type opposite the first conductivity type, an electrically conductive material, a first electrode, and a second electrode. The drift layer is formed of SiC and is situated onto the SiC substrate. The drift layer has the first conductivity type with an impurity concentration lower than that of the SiC substrate. The drift layer has a top surface and a bottom surface with the bottom surface contacting the SiC substrate. The trench extends from the top surface of the drift layer towards the SiC substrate. The barrier layer contacts the drifting layer and covers a sidewall and a bottom wall of the trench. The electrically conductive material at least partially fills the trench and contacts the barrier layer. The first electrode is situated on the top surface of the drift layer. The first electrode forms a Schottky junction with the drift layer and forms a low resistivity contact with the barrier layer and the electrically conductive material. The second electrode forms an ohmic contact with the SiC substrate. In an example embodiment, the barrier layer includes a buffer junction barrier (JB) sub layer with a first impurity concentration and a JB layer with a second impurity concentration. The first impurity concentration is lower than the second impurity concentration.

Other example embodiments are discussed herein.

DETAILED DESCRIPTION OF THE DRAWINGS

Figure 1A:
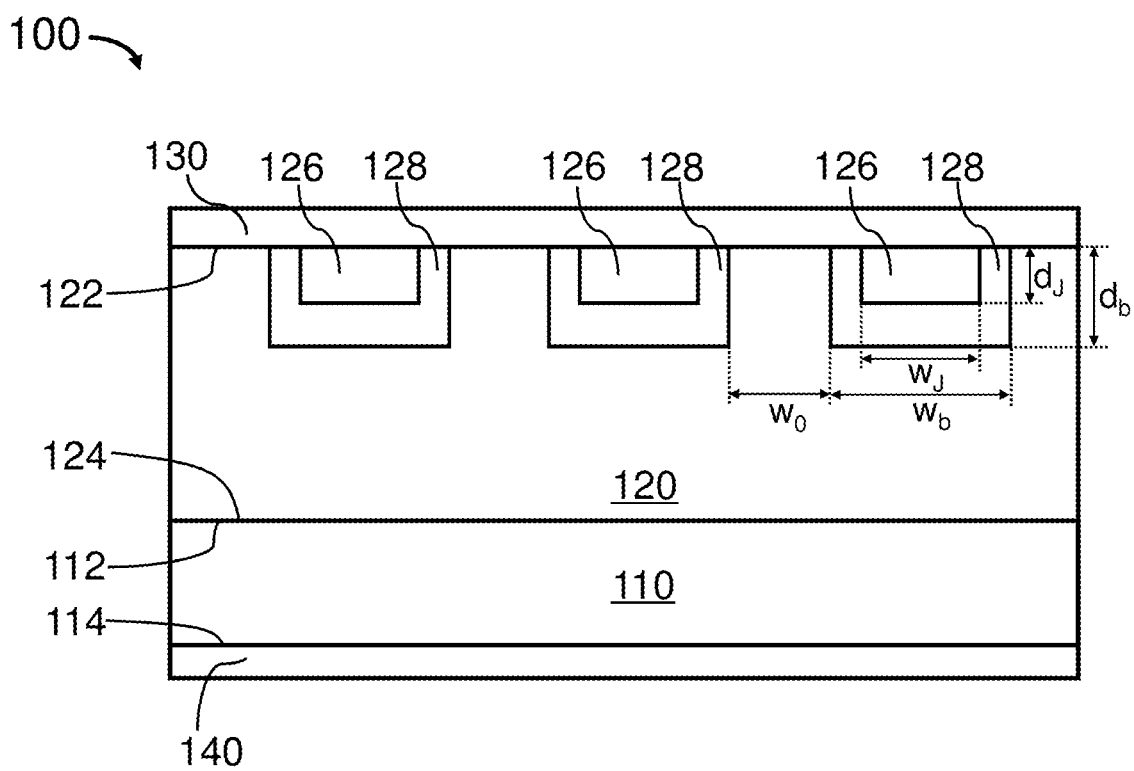
FIG. 1A illustrates a Schottky device with a planar structure in accordance with an example embodiment.

Example embodiments relate to Schottky devices with novel structure designs and improved performances, such as improved leakage and breakdown voltages.

Conventional or existing Schottky devices or diodes are disadvantageous in their high current leakage and low breakdown voltage under reverse bias. Conventional Schottky devices thus face limitations in many high power applications.

Furthermore, limitations exist regarding application of Silicon (Si)-based manufacturing processes to Silicon carbide (SiC)-based devices due to differences in their material properties. For example, for a Si-based process, an initial doping profile is generally formed with ion implantation. Initial overlap of the initial doping profile is not smooth and needs a thermal anneal to facilitate dopant redistribution to form an expected profile. However, this does not work well for SiC material as there is almost no dopant redistribution in SiC material during thermal anneal. The doping profile remains choppy and weak spots are formed that increase current leakage.

One or more example embodiments solve one or more of the technical problems associated with conventional Schottky devices as set forth above. One or more example embodiments achieve Schottky devices with improved device performance by providing newly-designed device structures and manufacturing processes to contribute to semiconductor technology.

One or more example embodiments achieve Schottky devices with improved performance, such as reduced leakage and improved breakdown voltage. For example, one example embodiment demonstrates a Schottky device with leakage approximately five times lower than that of its conventional counterparts. Advantages of example embodiments further include the proposed novel processes for manufacturing Schottky devices, which can be implemented with one or more benefits of simplicity, flexibility, and better alignment, etc. These novel processes overcome the non-transferability of Si-based process when manufacturing SiC-based devices. Schottky devices of example embodiments have broader and better applications compared with conventional Schottky devices.

Example embodiments includes a Schottky device with a planar structure, a shallow trench structure, and a deep trench structure respectively. A junction barrier (JB) region is enclosed by a buffer JB sub region with a lower impurity concentration compared with the JB region. Both the JB region and the buffer JB sub region have the conductivity type opposite that of a drift region. The buffer JB sub region is designed or configured such that a regulated doping junction is formed between the JB region and the Schottky region. As such, the maximal electric field between the JB region and Schottky region as well as the metal Schottky barrier is reduced, thereby improving overall performance for the Schottky device.

One or more example embodiments recognize that leakage mostly happens at the bottom and corners of the JB region and the surface of the Schottky junction or area under the Schottky metal. Enclosure of the JB region by the buffer JB sub region at the bottom (i.e., bottom enclosure) is designed to be larger than that at the sidewall of the JB region or lateral enclosure. The lateral enclosure and the bottom enclosure can be independently adjusted or obtained, for example, by designing process parameters. For example, the lateral enclosure can be designed optimally to reduce electric field at the sidewall of the JB region on one hand, and maintain a low turn-on resistance for the Schottky junction on the other hand, thereby achieving optimal performance. Furthermore, by having a tighter buffer JB sub region at the sidewall, forward voltage drop for the Schottky junction is prevented from increasing and can be retained at a low value, which contributes to fast switching speed and lower power consumption.

One or more example embodiments include novel manufacturing process for the Schottky devices. The JB regions and the buffer JB sub regions are formed by ion implantations without relying on or attributable to dopant redistribution. For Schottky devices with a planar structure or a shallow trench structure, a single oxide hard mask can be employed in formation of both the JB regions and the buffer JB sub regions with ion implantations, thereby self-alignment is achieved. For Schottky devices with a deep trench structure, a novel process including epitaxial growth is provided with simplicity and flexibility.

FIG. 1A illustrates a Schottky device 100 with a planar structure in accordance with an example embodiment.

The Schottky device 100 includes a substrate 110, a drift layer or region 120, one or more junction barrier (JB) regions or layers 126, one or more buffer JB sub regions or layers 128, an anode or first electrode or first metal layer 130, and a cathode or second electrode or second metal layer 140.

By way of example, the substrate 110 has a first surface 112 and a second surface 114 opposite the first surface 112. The substrate 110 includes or is formed of silicon carbide (SiC) of a first conductivity type (e.g., n-type). As an example, the substrate 110 is highly n-doped SiC with an impurity or doping concentration of $5.0E19$ $cm^{-3}$ (i.e., $5.0\times10^{19}$ $cm^{-3}$) or greater.

By way of example, the drift layer 120 is situated or disposed on the substrate 110. The drift layer 120 has a top surface 122 and a bottom surface 124. The bottom surface 124 contacts the first surface 112 of the substrate 110.

The drift layer 120 includes dopants or impurities of the first conductivity type with an impurity concentration lower than that of the substrate 110. As an example, the drift layer 120 is n-doped with a concentration in a range from $5.0E14$ $cm^{-3}$ to $2.0E16$ $cm^{-3}$ and has a thickness range from 5 micrometer (um) to 80 um. In an example embodiment, the impurity concentration of the drift layer 120 is $8.5E15$ $cm^{-3}$. As another example, the drift layer 120 is n-doped SiC that is epitaxially grown onto the substrate 110.

By way of example, the JB region 126 is included in the drift layer 120 and extends from the top surface 122 towards the substrate 110. The JB region 126 has a width $w_J$ and a depth $d_J$ beneath the top surface 122. In an example embodiment, the width $w_J$ varies in a range from 0.5 um to 4.0 um, and the depth $d_J$ varies in a range from 0.3 um to 1.0 um.

The JB region 126 includes dopants of a second conductivity type (e.g., p-type) opposite the first conductivity type and has a first impurity concentration. For example, the JB region 126 can be formed by ion implantation.

By way of example, the buffer JB sub region 128 is included in the drift layer 120 and extends from the top surface 122 towards the substrate 110. The buffer JB sub region 128 has a width $w_b$ and a depth $d_b$. In an example embodiment, the depth $d_b$ is in a range from 0.7 um to 1.5 um. The width $w_b$ is larger than the width $w_J$ by 0.6 um to 2.0 um (i.e., lateral enclosure of the JB region 126 by the buffer JB sub region 128 is in a range from 0.3 um to 1.0 um per side).

The buffer JB sub region 128 encloses the JB region 126 with a lateral enclosure dimension (i.e., $(w_b-w_J)/2$) and a bottom enclosure dimension (i.e., $d_b-d_J$). The lateral enclosure dimension is smaller than the bottom enclosure dimension. The lateral enclosure dimension and the bottom enclosure dimension are adjustable independent on each other.

By way of example, if the lateral enclosure dimension is too small, the buffer JB sub region cannot effectively shield the Schottky junction under reverse bias and cannot effectively reduce the maximal electric field at the interface of the JB region and the Schottky region (As used herein, the "Schottky region" refers to the region between the JB regions in the drift layer 120 where Schottky junction is formed at the surface), thereby being not effective in reducing leakage and increasing breakdown voltage. On the other hand, if the lateral enclosure dimension is too large, it will reduce the area of Schottky junction and thus reduce the forward current of the Schottky device. The capability of independently adjusting the lateral enclosure dimension in accordance with example embodiments are favorable or useful because an optimal lateral enclosure dimension can be achieved without negatively influencing other device parameters, such as depths and impurity concentrations of the JB regions and the buffer JB sub regions. Schottky device in accordance with example embodiments can be designed and manufactured with flexibility.

By way of example, as illustrated in FIG. 1A, the buffer JB sub region 128 fully encloses the JB region 126 in relation to sidewall and bottom wall. In this manner, the buffer JB sub region 128 provides effective shielding for the JB region 126 such that the maximal electric field between the JB region 126 and the Schottky region is reduced and overall performance for the Schottky device is improved.

By way of example, the buffer JB sub region 128 is of the second conductivity type with a second impurity concentration that is smaller than the first impurity concentration. In an example embodiment, the first impurity concentration is in a range from $7.0E18$ $cm^{-3}$ to $6.0E20$ $cm^{-3}$, and the second impurity concentration is in a range from $1.0E17$ $cm^{-3}$ to $6.0E18$ $cm^{-3}$.

In one example embodiment, there are more than one set of JB regions and buffer JB sub regions. The distance $w_0$ between two adjacent buffer JB sub regions 128 from two adjacent sets of JB regions and buffer JB sub regions respectively is in a range from 2 um to 6 um. As an example, $w_0=3$ um.

By way of example, the JB region 126 and the buffer JB sub region 128 can include dopants of same or different species. In one example embodiment, the JB region 126 includes dopants of aluminum (Al), and the buffer JB sub region 128 includes one or more dopants selected from a group consisting of Al, Boron (B), and Gallium (Ga).

By way of example, the anode 130 is situated on the top surface 122 of the drift layer 120. The anode 130 forms a Schottky junction with exposed portions of the top surface 122 of the drift layer 120, and forms a low resistivity contact with the JB region 126. The anode 130 can be a metal layer, such as aluminum (Al), titanium (Ti), nickel (Ni), or can be a multi-metal structure formed of two or more metals. In an example embodiment, the anode 130 includes multiple metal structures that are short-circuited.

By way of example, the cathode 140 contacts the second surface 114 to form a low resistivity contact with the substrate 110. As an example, the cathode 140 includes one or more metals, such as nickel (Ni), titanium (Ti), silver (Ag), platinum (Pt), gold (Au) or the like that is capable of forming an ohmic contact with the SiC substrate.

Figure 1B:
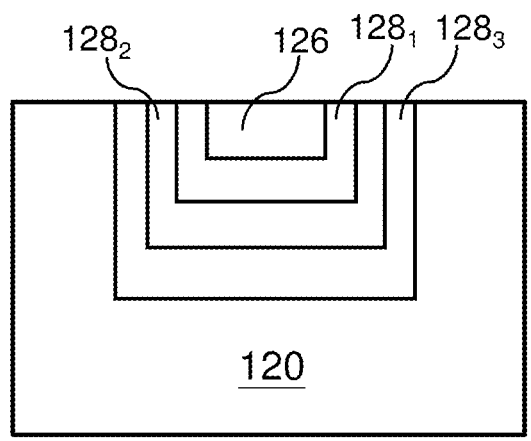
FIG. 1B illustrates a junction barrier (JB) region enclosed by more than one buffer JB sub region in accordance with an example embodiment.

Although FIG. 1A illustrates three sets of JB region and buffer JB sub region, and each set illustratively includes one JB region and one buffer JB sub region, a person having ordinary skill in the art would appreciate that each set can include multiple layers of buffer JB sub regions with regulated doping profiles according to practical requirements. This is illustrated in FIG. 1B. FIG. 1B illustrates a JB region 126, and three buffer JB sub regions 1281, 1282, and 1283 in the drift layer 120 in accordance with an example embodiment. The impurity concentration decreases from the JB region 126 towards the buffer JB sub region 1283.

By way of example, the shapes of the JB region and the buffer JB sub region from a top or plane view can be predetermined or designed. For example, the shapes can be circular, square, hexagonal, strip, or other suitable shapes according to practical requirements. This is illustrated in FIGS. 2 and 3.

Figure 2:
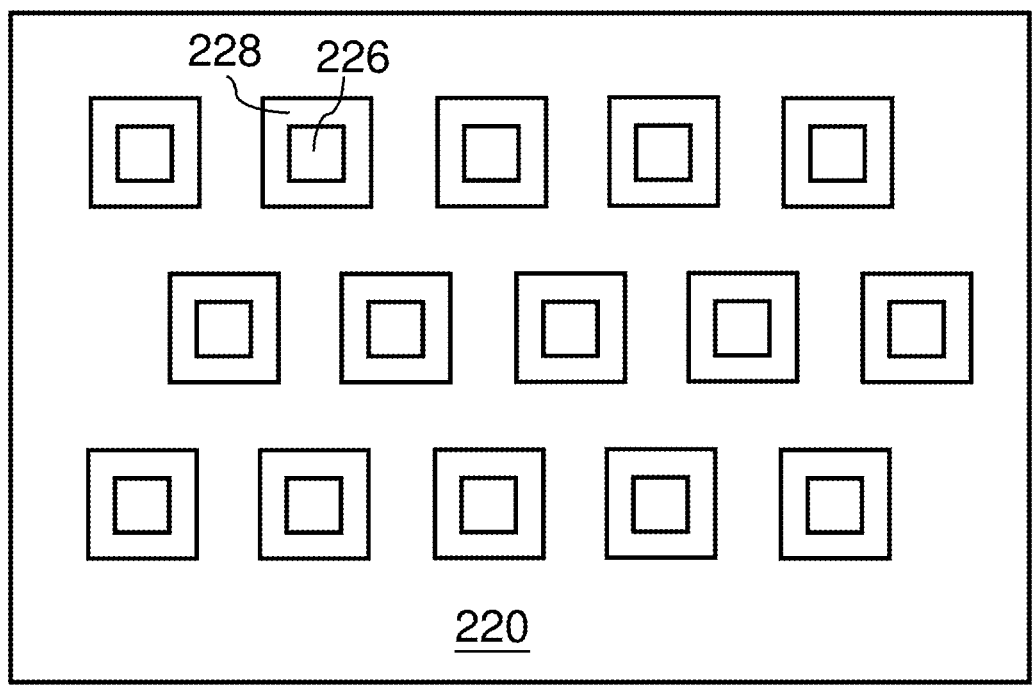
FIG. 2 illustrates a top view of JB regions and buffer JB sub regions in accordance with an example embodiment.

FIG. 2 illustrates a top view of JB regions and buffer JB sub regions in accordance with an example embodiment. As illustrated, both the JB regions 226 and the buffer JB sub regions 228 are square shape on the top surface of the drift layer 220.

Figure 3:
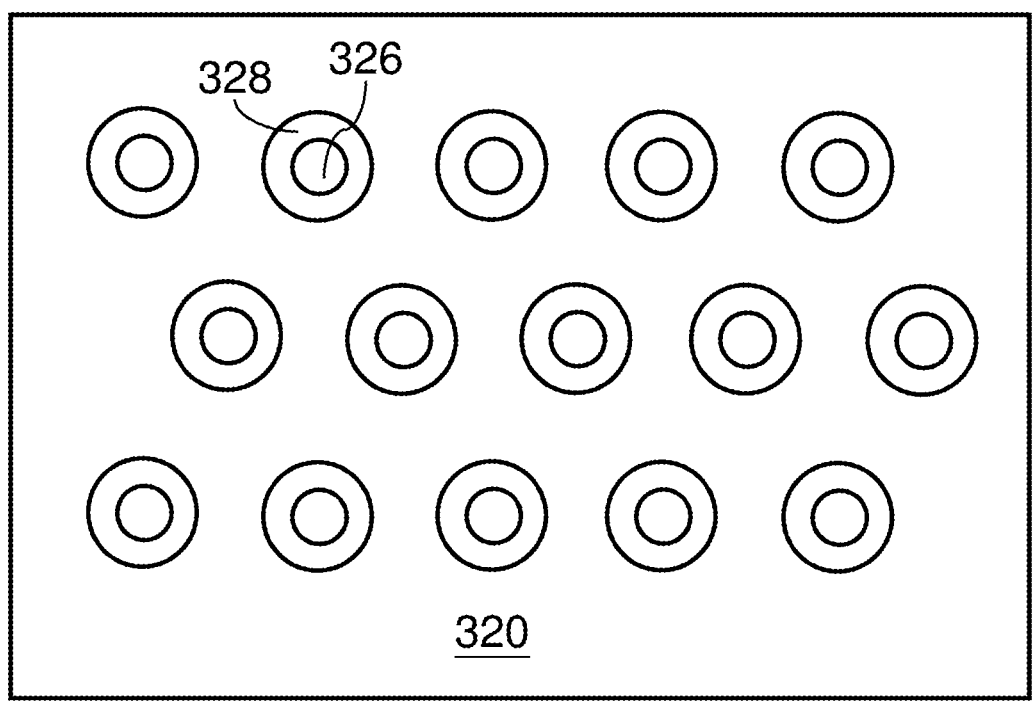
FIG. 3 illustrates a top view of JB regions and buffer JB sub regions in accordance with another example embodiment.

FIG. 3 illustrates a top view of JB regions and buffer JB sub regions in accordance with another example embodiment. As illustrated, both the JB regions 326 and the buffer JB sub regions 328 are circular shape on the top surface of the drift layer 320.

The Schottky device with structure as shown in FIG. 1A reduces maximum electric field at the junction formed at an interface between the JB region and the drift layer or Schottky region, thereby reducing reverse current leakage and increasing breakdown voltage.

The shapes as shown in FIGS. 2 and 3 are for illustrative purpose only. A person having ordinary skill in the art would appreciate that the shapes for the JB regions and the buffer JB sub regions from a top view can be other suitable shapes, such as rectangular shape, stripe shape etc., according to practical requirements.

Figures 4A, 4B:
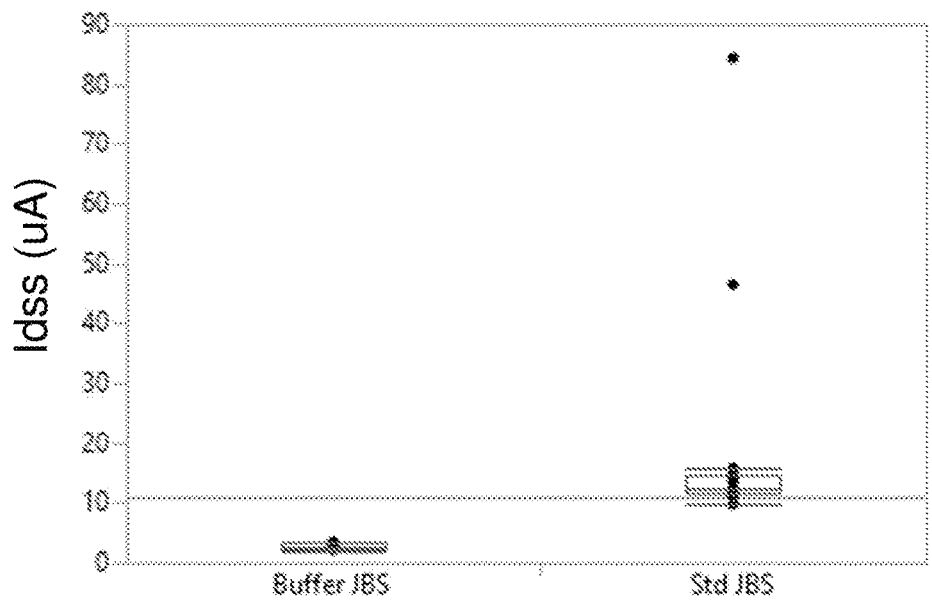
FIG. 4A shows a graph illustrating a performance comparison between a Schottky device with a planar structure in accordance with an example embodiment and a conventional Schottky device.
FIG. 4B is a table showing values for current leakage for a Schottky device with a planar structure in accordance with an example embodiment and a conventional Schottky device.

FIG. 4A shows a graph 410 illustrating a performance comparison between a Schottky device with structure with reference to FIG. 1A ("Buffer JBS") and a conventional Schottky device ("Std JBS"). FIG. 4B is a table 420 showing values of leakage current.

The "Buffer JBS" includes a SiC drift layer of 11um in thickness and being n-doped with an impurity concentration of $8.5E15$ $cm^{-3}$ $d_j=0.4$ um, $w_j=2.0$ um, $d_b=0.9$ um, $w_b=3.0$ um, $w_0=3.0$ um. The breakdown voltage is above 1200V.

The "Std JBS" includes only a JB region without a Buffer JB sub region. The width and depth for the JB region of the "Std JBS" are 3.0 um and 0.9 um respectively. The JB region of the "Std JBS" has a same impurity concentration as that for the JB region of the "Buffer JBS".

As shown in FIGS. 4A and 4B, compared with the median leakage current at 1200V reverse bias for "Std JBS", the median leakage current for the "Buffer JBS" is 2.6 uA, which is about 5 times lower than that for the "Std JBS" (12.2 uA). In addition, the leakage currents for "Buffer JBS" group are more stable with less variation compare to the standard JBS structure.

Figure 5:
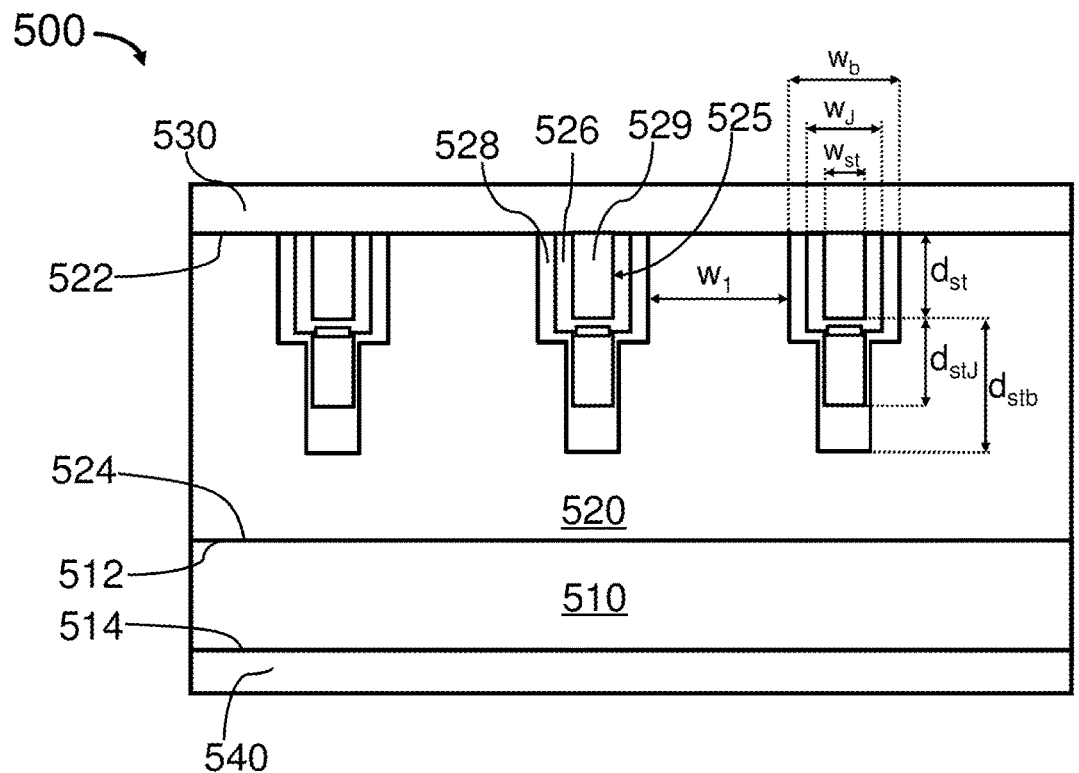
FIG. 5 illustrates a Schottky device with a shallow trench in accordance with an example embodiment.

FIG. 5 illustrates a Schottky device 500 with a shallow trench in accordance with an example embodiment.

For purpose of clarify, details that are same as or similar to the description with reference to FIG. 1A are omitted or stated briefly hereinafter. Elaboration is mainly focused on differences.

As illustrated, the Schottky device 500 includes a substrate 510 with a first surface 512 and a second surface 514, a drift layer 520 with a top surface 522 and a bottom surface 524, one or more trenches 525, one or more junction barrier (JB) regions 526, one or more buffer JB sub regions 528, an anode or first electrode or first metal layer 530, and a cathode or second electrode or second metal layer 540. By way of example, both the substrate 510 and the drift layer 520 include SiC material of a first conductivity type (e.g., n-type).

By way of example, the trench 525 is formed in the drift layer 520 and extends from the top surface 522 of the drift layer 520 towards the substrate 510. The trench 525 has a width $w_{st}$ and a depth $d_{st}$ beneath the top surface 522 of the drift layer 520. In an example embodiment, the width $w_{st}$ is in a range from 0.5 um to 3.0 um, and the depth $d_{st}$ is in a range from 0.5 um to 1.5 um. The trench 525 is at least partially filled with one or more electrically conductive materials 529, such as p-doped poly-Si, metal (e.g., Al, Ti, Ni, etc), and the like.

By way of example, the JB region 526 is included in the drift layer 520 and extends from the top surface 522 towards the substrate 510. The JB region 526 encloses the trench 525 in relation to the sidewall and bottom of the trench 525. The JB region 526 has a width $w_j$ and a depth $d_{stJ}$ beneath the bottom of the trench 525. As an example, the depth $d_{stJ}$ is in a range from 0.8 um to 1.8 um. The width $w_j$ is in a range from 1 um to 4 um. In an example embodiment, the JB region 526 encloses the trench 525 with a lateral enclosure in a range from 0.25 um to 0.5 um.

By way of example, the JB region 526 includes dopants of a second conductivity type (e.g., p-type) opposite the first conductivity type and with a first impurity concentration.

By way of example, the buffer JB sub region 528 is included in the drift layer 520 and extends from the top surface 522 towards the substrate 510. The buffer JB sub region 528 has a width $w_b$ and a depth $d_{stb}$ beneath the bottom of the trench 525. As an example, the depth $d_{stb}$ is in a range from 1.1 um to 2.4 um. The width $w_b$ is in a range from 1.5 um to 5 um. In an example embodiment, the buffer JB sub region 528 encloses the JB region 526 with a lateral enclosure in a range from 0.25 um to 0.5 um.

The buffer JB sub region 528 encloses the JB region 526 with a lateral enclosure dimension (i.e., $(w_b-w_J)/2$) and a bottom enclosure dimension (i.e., $d_{stb}-d_{stJ}$). The lateral enclosure dimension is smaller than the bottom enclosure dimension. The lateral enclosure dimension can be adjusted independent on the bottom enclosure dimension.

The buffer JB sub region 528 includes dopants of the second conductivity type (e.g., p-type) and with a second impurity concentration. The doping concentration for the buffer JB sub region 528 is lower than that for the JB region 526 such that maximal electric filed at PN junctions between the JB region 526 and the drift layer 520 under reverse voltage is reduced, thereby improving overall device performance, such as leakage and breakdown voltage.

In an example embodiment, the JB region 526 and the buffer JB sub region 528 have same dopant specie selected from a group consisting of Aluminum (Al), Boron (B), and Gallium (Ga). In another example embodiment, the JB region 526 and the buffer JB sub region 528 have different dopant species selected from a group consisting of Al, B, and Ga.

By way of example, there are more than one set of trenches, JB regions and buffer JB sub regions, the distance w1 between two adjacent buffer JB sub regions from two adjacent sets respectively is in a range from 2 um to 6 um.

In an example embodiment, the buffer JB sub region 528 includes plural buffer JB sub regions with each having a different impurity concentration.

By way of example, the first metal layer 530 disposed on the drift layer 520. The first metal layer 530 forms a Schottky junction with exposed portions of the drift layer 520, and forms a low resistivity contact with the JB region and the one or more electrically conductive materials 529.

By way of example, the second metal layer 540 form an ohmic contact with the SiC substrate 510.

In an example embodiment, thickness of drift layer=12.0 um, $w_{st}$=1.0 um, $w_b$=2.0 um, $d_{st}$=0.8 um, $d_{stJ}$=1.1 um, $d_{st}b$=1.5 um, $w_1$=3.0 um, and the SiC Schottky device with such parameters has a breakdown voltage of greater than 1200V.

Figure 6:
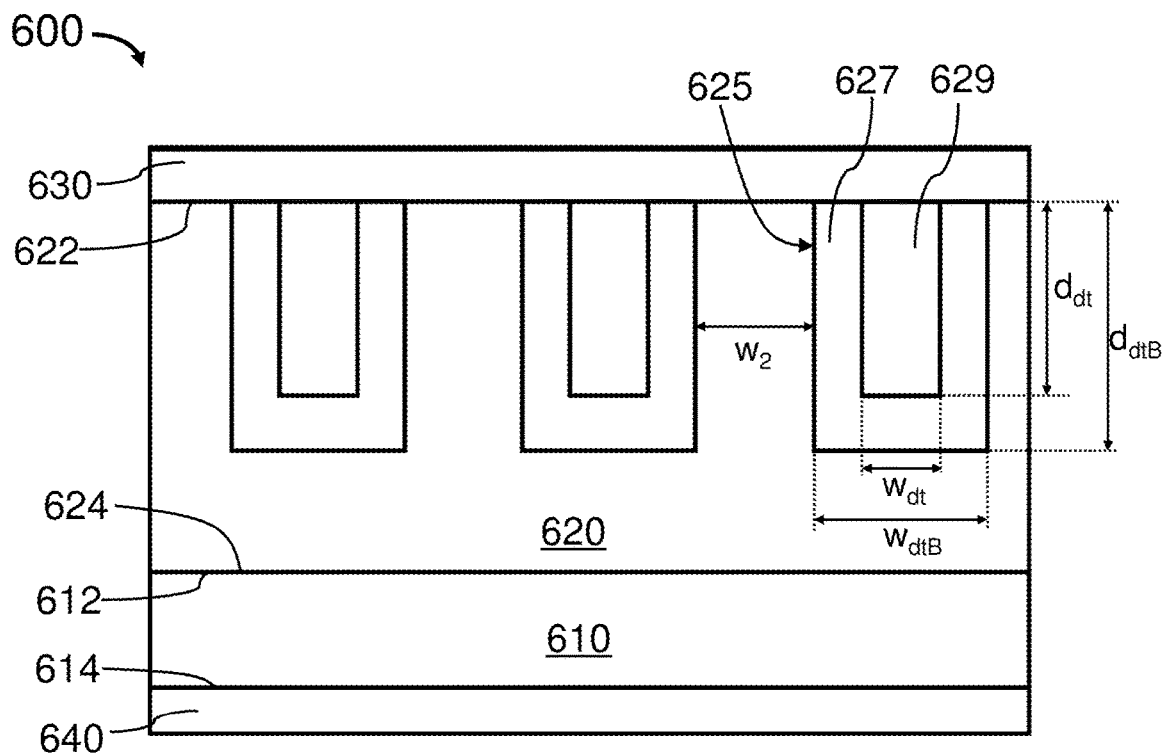
FIG. 6 illustrates a Schottky device with a deep trench in accordance with an example embodiment.

FIG. 6 illustrates a Schottky device 600 with a deep trench in accordance with an example embodiment.

As illustratively shown, the Schottky device 600 includes a substrate 610, a drift layer 620, one or more trenches 625, one or more barrier layers or regions 627, an anode or first metal layer 630, and a cathode or second metal layer 640.

By way of example, the substrate 610 has a first surface 612 and a second surface 614. The substrate 610 includes SiC of a first conductivity type (e.g., n-type).

By way of example, the drift layer 620 is situated or disposed on the substrate 610. The drift layer 620 has a top surface 622 and a bottom surface 624. The drift layer 620 is of the first conductivity type with an impurity concentration lower than that of the substrate 610. In an example embodiment, the thickness of the drift layer 620 is equal to or greater than 6.5 um.

By way of example, the trench 625 is formed in the drift layer 620 and extends from the top surface 622 towards the substrate 610. The trench 625 has a width $w_{dtB}$ and a depth $d_{dtB}$ beneath the top surface 622 of the drift layer 620. As an example, the width $W_{dtB}$ is in a range from 1.0 um to 3.0 um. The depth $d_{dtB}$ is in a range from 1.5 um to 5.0 um.

Inside the trench 625 forms (e.g., by selective epitaxial growth) the barrier layer or region 627 of a second conductivity type (e.g., p-type). The barrier layer 627 covers the sidewall and the bottom wall of the trench 625 and contacts the drifter layer 620.

By way of example, the barrier layer 627 has a doping profile with an impurity concentration increasing from the drift layer 620 towards one or more electrically conductive materials 629 that at least partially fills the trench 625. In an example embodiment, the barrier layer 627 is an epitaxial layer formed of one or more materials selected from a group consisting of Gallium nitride (GaN), and Silicon Carbide (SiC).

In an example embodiment, the barrier layer 627 includes a buffer junction barrier (JB) sub layer with a first impurity concentration and a JB layer with a second impurity concentration. The buffer JB sub layer is sandwiched between the drift layer 620 and the JB layer. The first impurity concentration is lower than the second impurity concentration. This will be detailed later with reference to FIG. 7.

The rest of the trench 625 is at least partially filled with the one or more electrical materials 629. As used herein, "the rest of the trench" refers to internal space of the trench excluding the space occupied by the barrier layer. The barrier layer 627 is sandwiched between the one or more electrical materials 629 and the sidewall, the bottom wall of the trench 625. In some example embodiments, the one or more electrical materials 629 are unnecessary. Instead, the whole trench 625 is filled with the barrier layer 627. In some other embodiments, the barrier layer 627 includes both a JB region and a buffer JB sub region.

In an example embodiment, the rest of the trench 625 has a width $w_{dt}$ and a depth $d_{dt}$ beneath the top surface 622. As an example, the width $w_{dt}$ is in a range from 0 um to 2 um. The depth $d_{dt}$ is in a range from 0 um to 2.5 um.

In an example embodiment including more than one trench, the distance $w_2$ between two adjacent trenches is in a range from 2 um to 6 um.

By way of example, the first metal layer 630 is situated on the drift layer 620. the first metal layer 630 forms a Schottky junction with exposed portions of the top surface 622 of the drift layer 620, and forms a low resistivity contact with the barrier layer 627 and the one or more electrically conductive materials 629.

By way of example, the second metal layer 640 forms an ohmic contact with the SiC substrate 610.

In an example embodiment, thickness of drift layer=12.5 um, $w_{dt}$=0.6 um, $w_{dtB}$=1.6 um, $d_{dt}$=1.7 um, $d_{dtB}$=2.2 um, $w_2$=3.0 um, and the SiC Schottky device with such parameters has a breakdown voltage of greater than 1200V.

Figure 7:
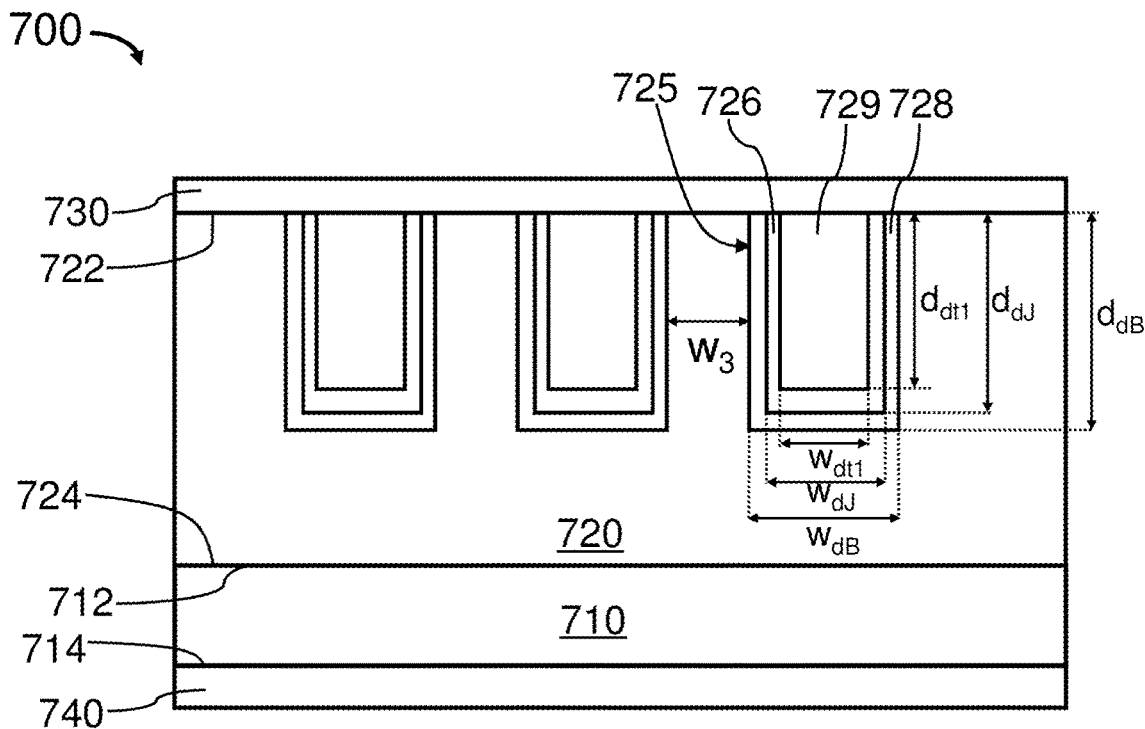
FIG. 7 illustrates a Schottky device with a deep trench in accordance with another example embodiment.

FIG. 7 illustrates a Schottky device 700 with a deep trench in accordance with another example embodiment.

As illustratively shown, the Schottky device 700 includes a substrate 710 with a first surface 712 and a second surface 714, a drift layer 720 with a top surface 722 and a bottom surface 724, one or more trenches 725, one or more electrically conductive materials 729 filled in the trench 725, an anode or first metal layer 730, and a cathode or second metal layer 740.

Compared with the Schottky device 600 with reference to FIG. 6, differences include that the barrier layer or region of Schottky device 700 includes a JB layer 726 and a buffer JB sub layer 728. The buffer JB sub layer 728 is sandwiched between the drift layer 720 and the JB layer 726. The buffer JB sub layer 728 covers the sidewall and the bottom wall of the trench 725.

As illustrated, the trench 725 has a width $w_{dB}$ and a depth $d_{dB}$ beneath the top surface 722. The JB layer has a width $w_{dJ}$ and a depth $d_{dJ}$ beneath the top surface 722. The rest of the trench 725 has a width wan and a depth data. The distance between two adjacent trenches is $w_3$.

In an example embodiment, the buffer JB sub layer 728 has a thickness of 300 nm to 1000 nm (i.e., $(w_{dB}-w_{dJ})/2=300$~$1000$ nm) and the JB layer 726 has a thickness of 200 nm to 1200 nm (i.e., $(w_{dJ}-w_{dt1})/2=200$~$1200$ nm).

Figure 8:
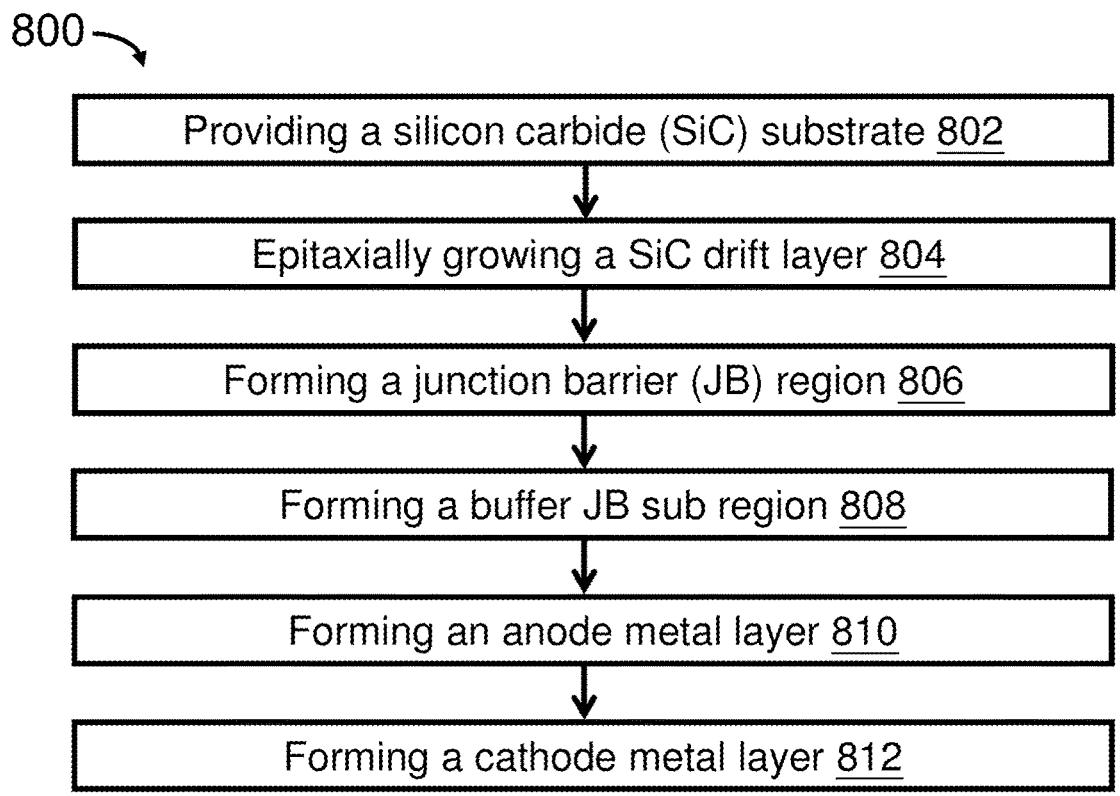
FIG. 8 illustrates a method that manufactures a Schottky device in accordance with an example embodiment.

FIG. 8 illustrates a method 800 that manufactures a Schottky device in accordance with an example embodiment. As an example, the method 800 is used to manufacture or produce the Schottky device 100 with reference to FIG. 1A with improved device performance.

Block 802 states providing a SiC substrate. For example, the SiC substrate is highly-doped with dopants of a first conductivity type, such as n-type dopants (e.g., Nitrogen, phosphorus, arsenic, etc.).

Block 804 states epitaxially growing a SiC drift layer. For example, the SiC drift layer is formed onto the SiC substrate with epitaxial growth with in-situ doping of the first conductivity type dopants.

Block 806 states forming a junction barrier (JB) region. For example, the JB region is formed by implanting dopants or impurities of a second conductivity type, such as p-type dopants (e.g., boron, aluminum, gallium, etc.), into a predetermined area in the drift layer. The JB region is formed attributable to ion implantations rather than impurity diffusion process. Regulated doping profile is formed by adjusting parameters such as ion beam energy, implantation dose, tilt and twist angles, etc. A single implantation process, or multiple or repeated implantation processes can be employed according to practical requirements.

By way of example, the JB region is formed by using an oxide hard mask. For example, a thick oxide layer (e.g., silicon oxide) is grown or deposited onto the top surface of the drift layer. Photoresist layer is formed (e.g., by spin-coating) onto the oxide layer and patterned with a mask such that portions of the oxide layer is isotropic etched to form one or more openings for selective implantation. Through these openings, by using the patterned oxide layer as a hard mask, dopant ions are implanted into the drift layer to form the JB region.

Figure 9A:
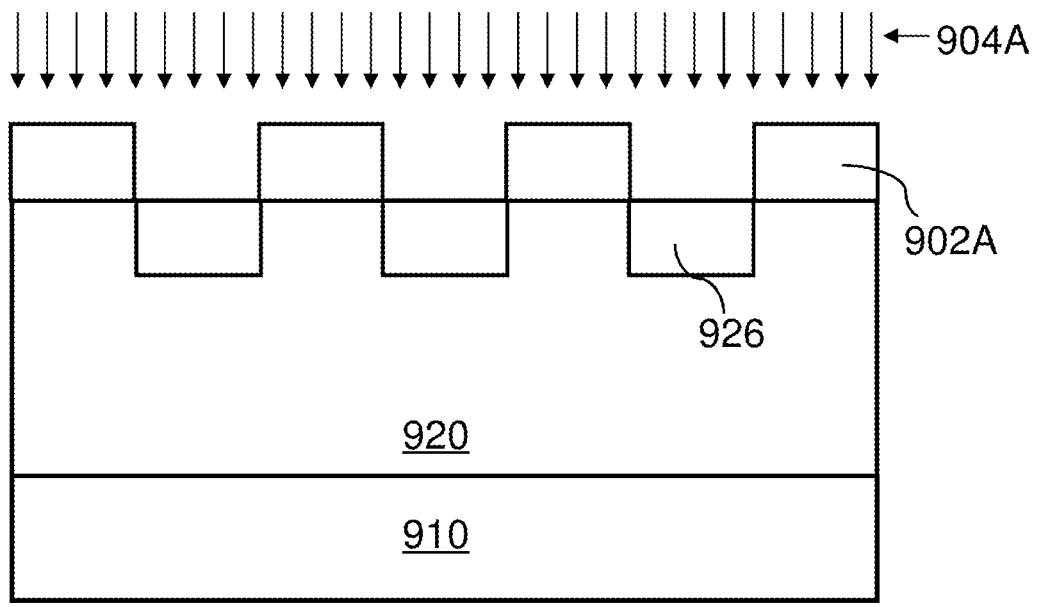
FIG. 9A illustrates forming a JB region by using an oxide layer as a hard mask in accordance with an example embodiment.

Usage of the patterned oxide layer as a hard mask is illustrated in FIG. 9A. As illustrated, the oxide layer is patterned (e.g., by wet etching or dry etching, or combination of both) to expose portions of the top surface of the drift layer 920 disposed on the substrate 910 such that ions or dopants 904A are implanted into the drift layer 920 to form the JB region 926. The remaining portions of the top surface are covered by oxide 902A to prevent ions from reaching the drift layer 920.

In one example embodiment, a chain of implantations is conducted to form an expected doping profile. In another example embodiments, one or more doping species are doped to form the JB region.

Block 808 states forming a buffer JB sub region. For example, the buffer JB sub region is formed by implanting dopants or impurities of the second conductivity type, such as p-type. The buffer JB sub region is formed attributable to ion implantations rather than impurity diffusion process. Regulated doping profile is formed by adjusting parameters such as ion beam energy, implantation dose, tilt angles, etc. A single implantation process, or a chain of implantation processes can be employed according to practical requirements.

Figure 9B:
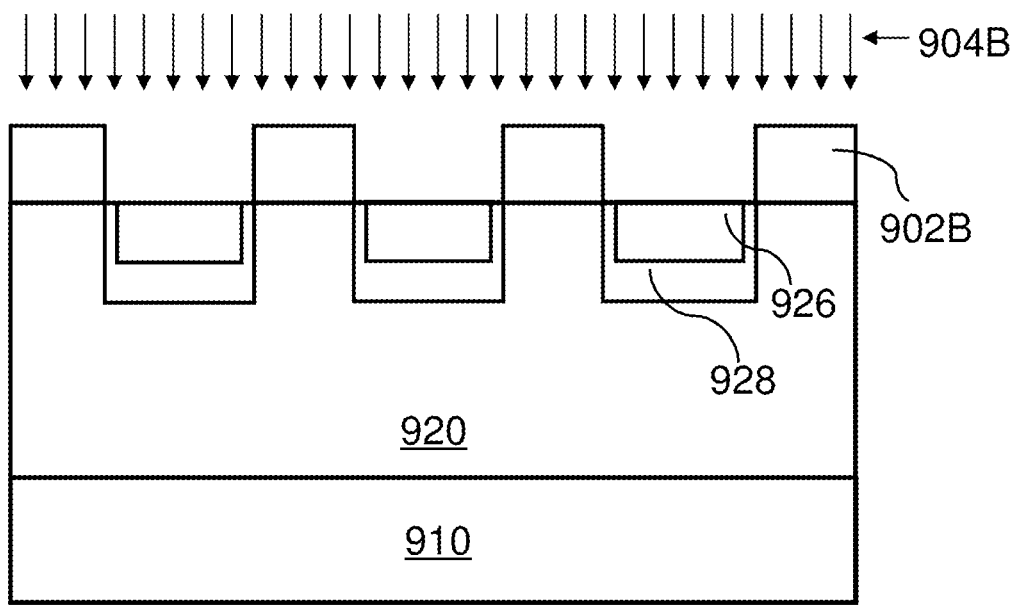
FIG. 9B illustrates forming a buffer JB sub region by using an oxide layer as a hard mask in accordance with an example embodiment.

By way of example, the buffer JB sub region is formed by using the same oxide layer as hard mask to achieve self-alignment. In an example embodiment, one or more wet chemical etching or isotropic etching processes are conducted on the oxide hard mask to trim or widen the openings to further open 0.3 um to 0.5 um per side, followed by an ion implantation process. Trimming the openings of the oxide hard mask is illustrated in FIG. 9B. The openings are widened by a predetermined size such that less oxide 902B is left coving the top surface of the drift layer 920 and more portions are exposed for ion implantation. Then ions 904B are implanted into the drift layer 920 to form the buffer JB sub region 928.

In an example embodiment, multiple trimming steps of the oxide hard mask are conducted. To obtain a tailored doping profile, the openings are trimmed or tailored for multiple times from small to large by wet etching or isotropic etching. Each time trimming of the openings is followed by an ion implantation process. In some example embodiments, process parameters such as ion beam energy, implantation dose, tilt and twist angle, dopant species or the like are adjusted each time such that expected doping depth, concentration and the like are achieved. In one example embodiment, with patterned oxide layer as a hard mask, p-type dopants (e.g., boron, aluminum, etc.) are implanted into the drift layer at a concentration of about $1.0E17$ cm$^{-3}$ to $6.0E18$ cm$^{-3}$.

In one example embodiment, instead of using an oxide hard mask, plural separate masks are employed to trim the openings such that the openings are sized from small to large for selective implantation to form the JB region and the buffer JB sub region.

Although ion implantation is shown in FIGS. 9A and 9B has a direction perpendicular to the top surface of the drift layer, a person having ordinary skill in the art would appreciate that implantation angle can be tilted according to practical applications.

In one example embodiment, the dopants in the JB region and the buffer JB sub region are thermally annealed at a temperature of 1600 degrees Celsius (° C.) or above. As an example, dopants are annealed or activated in a furnace with a carbon cap layer. A sacrifice oxidation at dry oxygen ($O_2$) at 900° C. to 1000° C. for 15 min to 30 min is conducted to remove carbon and silicon segregation formed at the SiC surface in the JB region after the high temperature anneal.

As another example, dopants are activated with microwave rapid thermal annealing (RTA) at 2000° C. to 2100° C. for a time period in a range from 5 seconds to 60 seconds. As a further example, dopant activation is conducted by direct pulse laser annealing (PLA) with wavelength at 308 nm to 355 nm at 1.5 J/cm$^2$ to 3.4 J/cm$^2$ either at room temperature or at evaluated temperature up to 800° C. and with either single shot or multiple anneal shots.

Block 810 states forming an anode metal layer. The anode metal layer can be a single metal layer or multiple metal structures.

In an example embodiment, after stripping off the oxide hard mask or oxide layer, a metal layer is deposited onto the drift region. The metal layer serves as the Schottky metal at the drift region, and server as the metal contact at the JB region. A rapid thermal annealing (RTA) is conducted at a medium temperature at 500° C. to 650° C. for 2 min to enhance the Schottky contact formation ideal factor.

Block 812 states forming a cathode metal layer. For example, the cathode metal layer is formed on a side of the substrate opposite the drift layer. The cathode metal layer includes a metal, such as Ni, Ti, Ag, Pt, or Au that is capable of forming a low resistivity contact with n-type silicon carbide.

Figure 10:
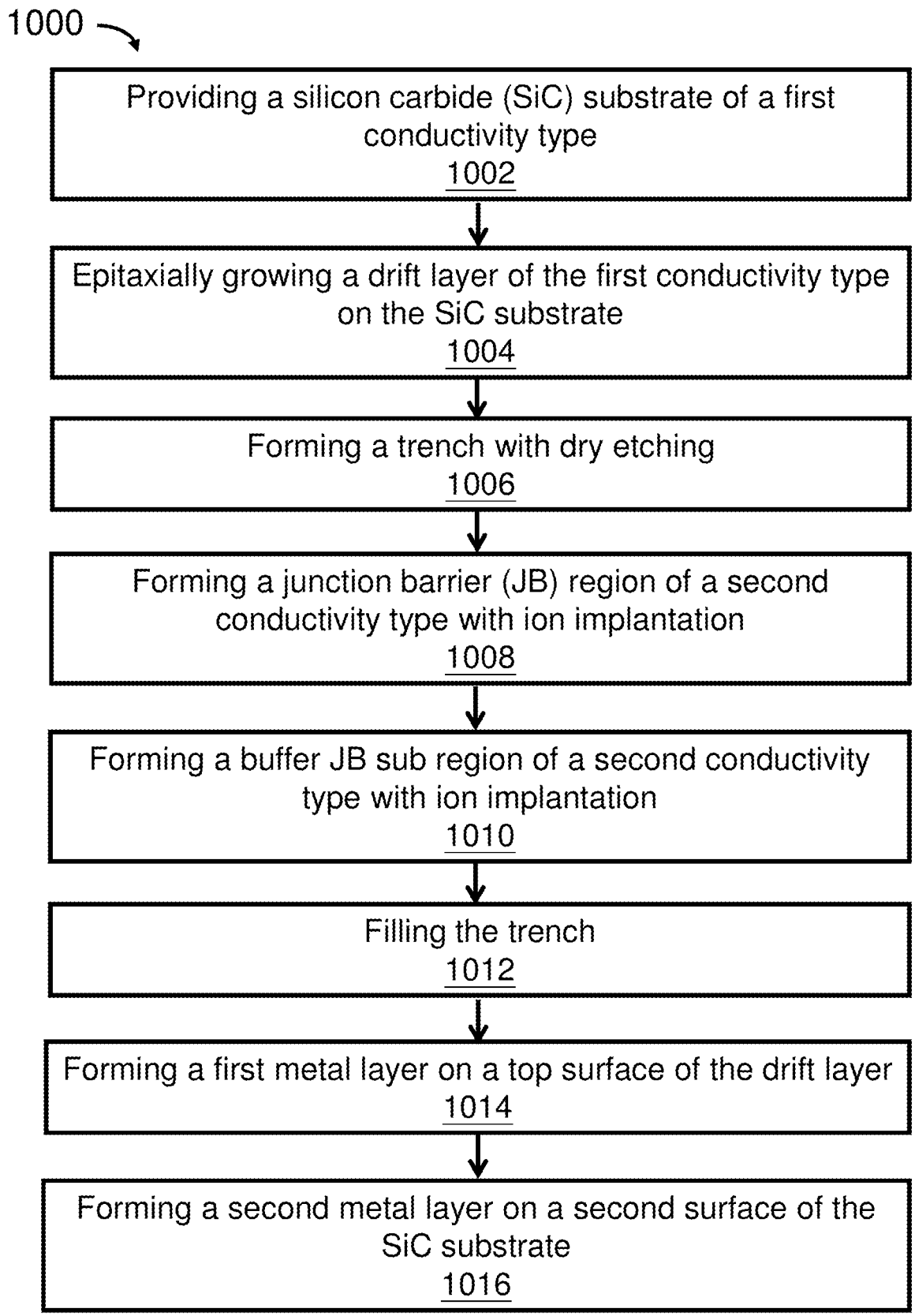
FIG. 10 illustrates a method that manufactures a Schottky device in accordance with an example embodiment.

FIG. 10 illustrates a method 1000 that manufactures a Schottky device in accordance with an example embodiment. For example, the method 1000 can be used to manufacture the Schottky device 500 with reference to FIG. 5.

Block 1002 states providing a SiC substrate of a first conductivity type. For example, the SiC substrate is highly doped with dopants of a first conductivity type, such as n-type dopants (e.g., nitrogen, phosphorus, arsenic, etc.).

Block 1004 states epitaxially growing a drift layer of the first conductivity type on the SiC substrate. For example, the SiC drift layer is formed onto the SiC substrate with epitaxial growth with in-situ doping of the first conductivity type dopants.

Block 1006 states forming a trench with dry etching. As an example, an oxide layer (e.g., silicon oxide) can be used as hard mask for dry etching (e.g., reactive-ion etching) to form the trench. For purpose of trench formation, the oxide layer can be patterned with one or more openings to form the hard mask. As another example, other separate mask can be used for dry etching to form the trench.

Block 1008 states forming a junction barrier (JB) region of a second conductivity type with ion implantation. As an example, the JB region is formed by trimming or tailoring or widening openings of the same oxide layer to expose more portions of the surface of the drift layer and then conducting one or more ion implantation steps. As another example, the step of trimming followed by ion implantation can be repeated for multiple times according to practical requirements.

Block 1010 states forming a buffer JB sub region of a second conductivity type with ion implantation. For example, many of statements with reference to block 808 of FIG. 8 are applicable to block 1010.

For example, an oxide layer is deposited onto the drift layer as a hard mask. Then the oxide layer is etched to form one or more openings. The one or more openings are trimmed by isotropic etching the oxide layer such that dopant ions of the second conductivity type are selectively implanted into the drift layer to form the JB region. Subsequently, the one or more opening are further trimmed by isotropic etching the oxide layer such that the dopant ions of the second conductivity type are selectively implanted into the drift layer to form the buffer JB sub region.

Block 1012 states filling the trench. For example, the trench is filled with one or more electrically conductive materials, such as p-doped poly-Si, metal (e.g., Al, Ti, Ni, etc), and the like.

Block 1014 states forming a first metal layer on a top surface of the drift layer. For example, many of statements with reference to block 810 of FIG. 8 are applicable to block 1014.

Block 1016 states forming a second metal layer on a second surface of the SiC substrate. For example, the second surface is a surface of the SiC substrate opposite the drift layer. For example, many of statements with reference to block 812 of FIG. 8 are applicable to block 1016.

Figure 11:
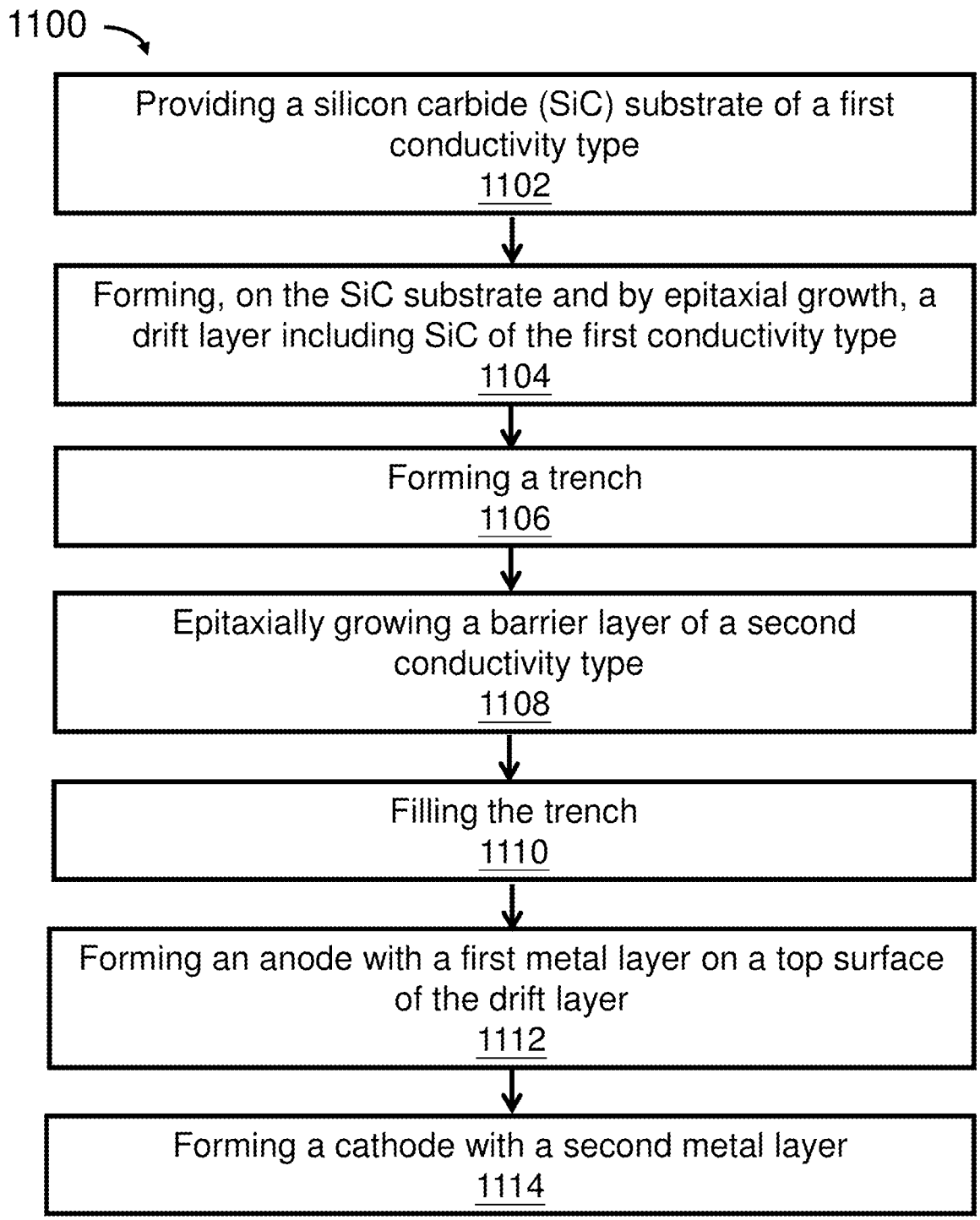
FIG. 11 illustrates a method that manufactures a Schottky device in accordance with an example embodiment.

FIG. 11 illustrates a method 1100 that manufactures a Schottky device in accordance with an example embodiment. For example, the method 1100 can be used to manufacture the Schottky device 600 with reference to FIG. 6 or the Schottky device 700 with reference to FIG. 7.

Block 1102 states providing a SiC substrate of a first conductivity type. For example, the SiC substrate is highly doped with dopants of a first conductivity type, such as n-type dopants (e.g., phosphorus, arsenic, etc.).

Block 1104 states forming, on the SiC substrate and by epitaxial growth, a drift layer including SiC of the first conductivity type. For example, the SiC drift layer is formed onto the SiC substrate with epitaxial growth with in-situ doping of the first conductivity type dopants.

Block 1106 states forming a trench. As an example, an oxide layer (e.g., silicon oxide) can be used as hard mask for dry etching (e.g., reactive-ion etching) to form the trench. For purpose of trench formation, the oxide layer can be patterned with one or more openings to form the hard mask. As another example, other separate mask can be used for dry etching to form the trench.

Block 1108 states epitaxially growing a barrier layer of a second conductivity type. For example, in-situ epitaxial growth with p-type doping is conducted to grow the barrier layer or region.

In one example embodiment, multiple epitaxial layers are grown with each layer having different impurity concentration. As an example, the multiple epitaxial layers include a JB layer and one or more buffer JB sub layers.

In another example embodiment, to form the barrier region, a first doped layer or buffer JB sub layer is formed by selective epitaxial growth (e.g., Metal-organic Chemical Vapor Deposition (MOCVD)) of doped SiC, or GaN, on sidewall and bottom wall of the trench. A second doped layer or JB layer is formed by selective epitaxial growth of doped SiC or GaN onto the first doped layer. The second doped layer has a higher impurity concentration than that of the first doped layer.

Block 1110 states filling the trench. For example, the trench is filled with one or more electrically conductive materials, such as p-doped poly-Si, metal (e.g., Al, Ti, Ni, etc.), and the like. In an example embodiment, the trench is filled with a Low-Pressure Chemical Vapor Deposition (LPCVD), Metal Organic Chemical Vapor Deposition (MOCVD), Atomic Layer Deposition (ALD) or the like. An etch back or chemical mechanical polished (CMP) process is conducted to bring the final trench fill plug 50 nm to 150 nm above the top surface of the drift layer.

Block 1112 states forming an anode with a first metal layer on a top surface of the drift layer. For example, many of statements with reference to block 810 of FIG. 8 are applicable to block 1112.

Block 1114 states forming a cathode with a second metal layer. For example, many of statements with reference to block 812 of FIG. 8 are applicable to block 1114.

As used herein, a "low resistivity contact" refers to a contact that readily allows the movement of electric charge. For example, an ohmic contact is one kind of low resistivity contact.

The present invention is illustrated by example embodiments in a non-limiting way. A person having ordinary skill in the art would appreciate description with reference to one example embodiment may be applicable to one or more other example embodiments. A person having ordinary skill in the art would conceive of one or more variations in accordance with example embodiments as illustrated herein, which still falls into scope of these example embodiments

What is claimed:

1. A semiconductor device, comprising:
a substrate;
a first semiconductor layer formed over the substrate;
a trench having a width and a depth formed into a surface of the first semiconductor layer and removing a portion of the first semiconductor layer defined by the trench;
a second semiconductor layer formed within the trench and extending from the surface of the first semiconductor layer to a bottom of the trench;
a third semiconductor layer formed over the second semiconductor layer in the trench and extending to the surface of the first semiconductor layer; and
an electrically conductive material deposited within the trench and extending to a portion of the third semiconductor layer formed at the bottom of the trench.

2. The semiconductor device of claim 1, further including:
a first conductive layer formed over the first semiconductor layer; and
a second conductive layer formed over the substrate.

3. The semiconductor device of claim 1, wherein an impurity concentration of the third semiconductor layer is greater than an impurity concentration of the second semiconductor layer.

4. The semiconductor device of claim 1, wherein the substrate includes a silicon carbide layer.

5. The semiconductor device of claim 1, wherein a first portion of the trench is wider than a second portion of the trench.

6. A semiconductor device including a plurality of cells, comprising:
a substrate;
a first semiconductor layer formed over the substrate; and
a first cell formed within the first semiconductor layer, the first cell including,
(a) a second semiconductor layer formed within a first trench having a width and a depth in the first semiconductor layer and extending from a surface of the first semiconductor layer to a bottom of the trench,
(b) a third semiconductor layer formed over the second semiconductor layer in the first trench and extending to the surface of the first semiconductor layer, and
(c) an electrically conductive material deposited within the first trench and extending to the third semiconductor layer.

7. The semiconductor device of claim 6, further including:
a first conductive layer formed over the first semiconductor layer; and
a second conductive layer formed over the substrate.

8. The semiconductor device of claim 6, wherein an impurity concentration of the third semiconductor layer is greater than an impurity concentration of the second semiconductor layer.

9. The semiconductor device of claim 6, wherein the substrate includes a silicon carbide layer.

10. The semiconductor device of claim 6, wherein a first portion of the first trench is wider than a second portion of the first trench.

11. The semiconductor device of claim 6, further including a second cell formed within the first semiconductor layer, the second cell including,
(a) the second semiconductor layer formed within a second trench in the first semiconductor layer, and
(b) the electrically conductive material deposited within the second trench over the second semiconductor layer.

12. A method of making a semiconductor device, comprising:
providing a substrate;
forming a first semiconductor layer over the substrate;
forming a trench having a width and a depth into a surface of the first semiconductor layer to remove a portion of the first semiconductor layer defined by the trench;
forming a second semiconductor layer within the trench;
forming a third semiconductor layer over the second semiconductor layer in the trench and extending to the surface of the first semiconductor layer; and
depositing an electrically conductive material within the trench and extending to the third semiconductor layer.

13. The method of claim 12, further including:
forming a first conductive layer over the first semiconductor layer; and
forming a second conductive layer over the substrate.

14. The method of claim 12, wherein an impurity concentration of the third semiconductor layer is greater than an impurity concentration of the second semiconductor layer.

15. The method of claim 12, wherein the substrate includes a silicon carbide layer.

16. The method of claim 12, wherein a first portion of the trench is wider than a second portion of the trench.

17. The method of claim 12, further including providing a second cell formed within the first semiconductor layer, the second cell including,
(a) the second semiconductor layer formed within a second trench in the first semiconductor layer, and
(b) the electrically conductive material deposited within the second trench over the second semiconductor layer.

* * * * *